(12) United States Patent
Shimada (10) Patent No.: US 9,803,162 B2
(45) Date of Patent: Oct. 31, 2017

(54) LIQUID COMPOSITION FOR CLEANING SEMICONDUCTOR DEVICE, AND METHOD FOR CLEANING SEMICONDUCTOR DEVICE

(71) Applicant: MITSUBISHI GAS CHEMICAL COMPANY, INC., Chiyoda-ku (JP)

(72) Inventor: Kenji Shimada, Tokyo (JP)

(73) Assignee: MITSUBISHI GAS CHEMICAL COMPANY, INC., Chiyoda-ku (JP)

( * ) Notice: Subject to any disclaimer, the term of this patent is extended or adjusted under 35 U.S.C. 154(b) by 0 days.

(21) Appl. No.: 15/118,230

(22) PCT Filed: Mar. 31, 2015

(86) PCT No.: PCT/JP2015/060129
§ 371 (c)(1),
(2) Date: Aug. 11, 2016

(87) PCT Pub. No.: WO2015/156171
PCT Pub. Date: Oct. 15, 2015

(65) Prior Publication Data
US 2017/0183607 A1    Jun. 29, 2017

(30) Foreign Application Priority Data

Apr. 10, 2014 (JP) ................ 2014-080944

(51) Int. Cl.
*C11D 7/50* (2006.01)
*C11D 11/00* (2006.01)
(Continued)

(52) U.S. Cl.
CPC ........... *C11D 11/0047* (2013.01); *C11D 7/06* (2013.01); *C11D 7/3209* (2013.01);
(Continued)

(58) Field of Classification Search
CPC .................................................. C11D 11/0047
(Continued)

(56) References Cited

U.S. PATENT DOCUMENTS

2003/0148624 A1    8/2003    Ikemoto et al.
2004/0220065 A1    11/2004    Hsu
(Continued)

FOREIGN PATENT DOCUMENTS

CN     1716104 A     1/2006
CN     101632042 A   1/2010
(Continued)

OTHER PUBLICATIONS

Office Action dated Feb. 1, 2017, in European Patent Application No. 15776802.9.

(Continued)

*Primary Examiner* — Gregory Webb
(74) *Attorney, Agent, or Firm* — Oblon, McClelland, Maier & Neustadt, L.L.P.

(57) ABSTRACT

A liquid semiconductor device cleaning composition used in a process of fabricating a semiconductor integrated circuit, for removing a hard mask or a dry etch residue while suppressing damage to a low-dielectric-constant interlayer dielectric film and cobalt or a cobalt alloy, where the liquid semiconductor device cleaning composition contains hydrogen peroxide at 10-30% by mass, potassium hydroxide at 0.005-0.7% by mass, aminopolymethylene phosphonic acid at 0.00001-0.01% by mass, at least one selected from amines and azoles at 0.001-5% by mass and water. A semiconductor device can be cleaned by bringing the liquid cleaning composition into contact with the semiconductor device.

10 Claims, 2 Drawing Sheets

(51) Int. Cl.
*C11D 7/36* (2006.01)
*C11D 7/06* (2006.01)
*C11D 7/32* (2006.01)
*H01L 21/02* (2006.01)
*H01L 21/311* (2006.01)
*H01L 21/768* (2006.01)

(52) U.S. Cl.
CPC .............. *C11D 7/3281* (2013.01); *C11D 7/36* (2013.01); *H01L 21/02063* (2013.01); *H01L 21/31116* (2013.01); *H01L 21/31144* (2013.01); *H01L 21/76807* (2013.01)

(58) Field of Classification Search
USPC ........................................................ 510/175
See application file for complete search history.

(56) References Cited

U.S. PATENT DOCUMENTS

| | | |
|---|---|---|
| 2005/0288199 A1 | 12/2005 | Oowada et al. |
| 2009/0120457 A1 | 5/2009 | Naghshineh et al. |
| 2010/0029085 A1 | 2/2010 | Matsunaga et al. |
| 2010/0051066 A1 | 3/2010 | Kuwabara et al. |
| 2010/0190347 A1 | 7/2010 | Ramachandrarao et al. |
| 2014/0374904 A1 | 12/2014 | Matsumoto et al. |
| 2015/0152366 A1 | 6/2015 | Shimada et al. |
| 2015/0210966 A1* | 7/2015 | Shimada ................. G03F 7/425 438/703 |
| 2016/0130500 A1* | 5/2016 | Chen ........................ C11D 3/30 216/13 |
| 2016/0177457 A1* | 6/2016 | Yokomizo ......... H01L 21/32134 438/754 |

FOREIGN PATENT DOCUMENTS

| | | |
|---|---|---|
| JP | 2003-234307 A | 8/2003 |
| JP | 2004-536910 A | 12/2004 |
| JP | 2005-529363 A | 9/2005 |
| JP | 2010-232486 A | 10/2010 |
| JP | 2013-187350 A | 9/2013 |
| KR | 10-2010-0014961 A | 2/2010 |
| KR | 10-2015-0095615 A | 8/2015 |
| TW | 201406949 A | 2/2014 |
| WO | 03/104901 A2 | 12/2003 |
| WO | 2007/072727 A1 | 6/2007 |
| WO | 2008/114616 A1 | 9/2008 |

OTHER PUBLICATIONS

International Search Report dated Jun. 23, 2015 in PCT/JP2015/060129, filed Mar. 31, 2015.
F. Chen et al. "A Comparative Study of ULK Conduction Mechanisms and TDDB Characteristics for Cu Interconnects with and without CoWP Metal Cap at 32nm Technology", 2010 IEEE International Interconnect Technology Conference, IEEE, 2010, pp. 93-95.

* cited by examiner

LIQUID COMPOSITION FOR CLEANING SEMICONDUCTOR DEVICE, AND METHOD FOR CLEANING SEMICONDUCTOR DEVICE

TECHNICAL FIELD

The present invention relates to a liquid cleaning composition used in a process of fabricating a semiconductor integrated circuit, and to a method for cleaning a semiconductor device using the same.

More specifically, the present invention particularly relates to a liquid cleaning composition for cleaning a semiconductor device which is obtained by: laminating a barrier dielectric film, a low-dielectric-constant interlayer dielectric film, a hard mask and a photoresist on a substrate having a barrier metal, metal wiring and a low-dielectric-constant interlayer dielectric film; subjecting the photoresist to selective exposure followed by development to form a photoresist pattern; subsequently subjecting the hard mask, the low-dielectric-constant interlayer dielectric film and the barrier dielectric film laminated on the substrate to dry etch treatment using this photoresist pattern as a mask, so as to remove said hard mask and the dry etch residue while suppressing damage to the low-dielectric-constant interlayer dielectric film, the metal wiring, the barrier metal and the barrier dielectric film, and to a cleaning method using the same.

BACKGROUND ART

Generally, a highly integrated semiconductor device is fabricated by a series of steps comprising:

forming a conductive thin film such as a metal film or the like as a conductive wiring material and an interlayer dielectric film for insulating between the conductive thin films on an element such as a silicon wafer, and then uniformly applying a photoresist onto the surface of the resultant to provide a photosensitive layer, which is subjected to selective exposure and development to make a desired photoresist pattern; then, conducting dry etch treatment of the interlayer dielectric film using this photoresist pattern as a mask to form a desired pattern on the thin film; and, completely removing the photoresist pattern as well as the residue resulting from the dry etch treatment (hereinafter, referred to as a "dry etch residue") by oxygen plasma ashing, use of a cleaning solution, or the like.

Recently, along with more shrunken design rules, RC delay is becoming to get on top of the limitation of high-speed arithmetic processing. Accordingly, the interlayer dielectric film is making a shift from a silicon oxide film to a low-dielectric-constant interlayer dielectric film (a film with a dielectric constant of less than 3: hereinafter, referred to as a "low-dielectric-constant interlayer dielectric film"). Moreover, when a pattern of 0.2 μm or less is to be formed, a photoresist with a film thickness of 1 μm will result the aspect ratio of the pattern (a ratio obtained by dividing the thickness of the photoresist film by the line width of the photoresist) to be too large, causing problems such as destruction of the pattern. In order to solve this, a hard mask technique is sometimes employed, in which a film of a titanium (Ti) series, a silicon (Si) series or the like (hereinafter, referred to as a "hard mask") is inserted between the pattern film that is to be actually formed and the photoresist film so as to once transfer the photoresist pattern onto the hard mask by dry etch. Once the photoresist is removed, this hard mask is used as an etch mask to transfer the pattern onto the film that is to be actually formed by dry etch. According to this method, since the gas used upon etching the hard mask is exchangeable with the gas used upon etching the film that is to be actually formed, one can select a gas that ensures selectivity between the photoresist and the hard mask upon etching the hard mask, and a gas that ensures selectivity between the hard mask and the film to be actually etched upon etching the actual film. Therefore, it is advantageous in that a pattern can be formed while causing minimum damage to the actual film.

When the hard mask is removed by oxygen plasma, however, the low-dielectric-constant interlayer dielectric film may be exposed to the oxygen plasma or the like and may be damaged. For example, in a case of forming a pattern by a dual damascene process, a hard mask is removed by oxygen plasma after forming vias and trenches. Upon this removal, the low-dielectric-constant interlayer dielectric film of the vias and trenches is damaged, which causes a problem of significant deterioration of the electric characteristics. Meanwhile, since dry etch residues are attached to the wafer upon removal of the hard mask, the dry etch residues must also be removed at the same time.

Furthermore, since the current density of metal wiring has been increasing due to shrinking, a countermeasure is strongly required against electromigration, i.e., transport of a metal wiring material due to the current through the metal wiring material, which causes a hole in the metal wiring. As such countermeasures, there are methods in which cobalt or a cobalt alloy is formed on copper wiring as described in Non-patent Document 1 (2010 IEEE International Interconnect Technology Conference pp. 93-95), and methods in which cobalt or a cobalt alloy is used as a metal wiring material as described in Patent Document 1 (Japanese Unexamined Patent Application Publication No. 2013-187350).

Accordingly, there has been a need in fabricating a semiconductor device for a method for removing a hard mask and a dry etch residue while suppressing damage to a low-dielectric-constant interlayer dielectric film, cobalt or a cobalt alloy.

Patent Document 2 (International Publication No. WO 2008/114616) proposes a method of cleaning a semiconductor device with a cleaning composition containing hydrogen peroxide, aminopolymethylene phosphonic acids, potassium hydroxide and water.

Patent Document 3 (Japanese Unexamined Patent Application Publication No. 2010-232486) proposes an etch composition having pH greater than 8.5 and comprising at least one selected from the group consisting of ammonia, a compound having an amino group and a compound having a ring structure containing a nitrogen atom, and hydrogen peroxide in an aqueous medium.

Patent Document 4 (Japanese Unexamined Patent Application Publication (translation of PCT) No. 2005-529363) proposes a cleaning composition comprising a polar organic solvent selected from the group consisting of dimethylpiperidone, sulfones and sulfolanes, a base selected from the group consisting of tetraalkylammonium hydroxide, choline hydroxide, sodium hydroxide and potassium hydroxide, a chelator or a metal complexing agent selected from the group consisting of water and trans-1,2-cyclohexanediamine tetraacetic acid, and ethane-1-hydroxy-1,1-diphosphonate and ethylenediamine tetra(methylene phosphonic acid).

Patent Document 5 (Japanese Unexamined Patent Application Publication No. 2003-234307) proposes a method for cleaning a semiconductor device in which an aqueous sulfuric acid solution at 70° C. or higher is used for cleaning so that titanium nitride (TiN) film is removed while cobalt (Co) silicide is not etched.

Patent Document 6 (International Publication No. WO 2007/072727) proposes a residue removing composition for removing dry etch residues having pH of 1-7 and comprising hydrogen peroxide, an azole compound and a stabilizer for hydrogen peroxide.

PRIOR ART DOCUMENTS

Non-Patent Document

Non-Patent Document 1: 2010 IEEE International Interconnect Technology Conference pp. 93-95

Patent Documents

Patent Document 1: Japanese Unexamined Patent Application Publication No. 2013-187350
Patent Document 2: International Publication No. WO 2008/114616
Patent Document 3: Japanese Unexamined Patent Application Publication No. 2010-232486
Patent Document 4: Japanese Unexamined Patent Application Publication (translation of PCT) No. 2005-529363
Patent Document 5: Japanese Unexamined Patent Application Publication No. 2003-234307
Patent Document 6: International Publication No. WO 2007/072727

SUMMARY OF THE INVENTION

Problems to be Solved by the Invention

The present inventors, however, have newly found the following technical problems in the inventions described in Patent Documents 2-6.

The liquid cleaning composition described in Patent Document 2 cannot sufficiently suppress the damage to cobalt, and thus cannot be used for the intended purpose (see Comparative Example 1).

The etch composition described in Patent Document 3 is insufficient to remove the hard mask and the dry etch residue, and cannot sufficiently suppress damage to cobalt and the low-dielectric-constant interlayer dielectric film. Therefore, it cannot be used for the intended purpose. Moreover, ethylenediamine tetraacetic acid, diethylenetriamine pentaacetic acid, triethylenetetramine, tetraethylenepentamine, pentaethylenehexamine, 1,4,7,10-tetraazacyclododecane, 8-quinolinol, 8-hydroxyquinaldine and 2,2'-azodiphenol are ineffective as a stabilizing agent for hydrogen peroxide that is to be combined with a liquid cleaning composition of the present invention which comprises hydrogen peroxide, potassium hydroxide, an anticorrosive for cobalt and water (see Comparative Examples 2 and 9-17).

The cleaning composition described in Patent Document 4 is insufficient to remove the hard mask and the dry etch residue, and cannot sufficiently suppress damage to cobalt and the low-dielectric-constant interlayer dielectric film. Therefore, it cannot be used for the intended purpose (see Comparative Example 3).

The aqueous sulfuric acid solution described in Patent Document 5 is insufficient to remove the hard mask, and cannot sufficiently suppress damage to cobalt. Therefore, it cannot be used for the intended purpose (see Comparative Example 4).

The residue removing composition described in Patent Document 6 is insufficient to remove the hard mask and the dry etch residue, and cannot sufficiently suppress damage to cobalt. Therefore, it cannot be used for the intended purpose (see Comparative Example 7).

The objective of the present invention is to provide a liquid cleaning composition for removing a hard mask and a dry etch residue while suppressing damage to a low-dielectric-constant interlayer dielectric film, cobalt or a cobalt alloy upon fabricating a semiconductor device, and a cleaning method using the same.

Means for Solving the Problems

The present invention provides a method for solving the above-described problems. The present invention is as follows.

1. A liquid cleaning composition for removing a hard mask and a dry etch residue in a semiconductor device provided with a low-dielectric-constant interlayer dielectric film, the hard mask and cobalt or a cobalt alloy while suppressing damage to the low-dielectric-constant interlayer dielectric film and the cobalt or the cobalt alloy, the composition comprising hydrogen peroxide at 10-30% by mass, potassium hydroxide at 0.005-0.7% by mass, aminopolymethylene phosphonic acid at 0.00001-0.01% by mass, at least one selected from amines and azoles at 0.001-5% by mass, and water.
2. The liquid cleaning composition according to Item 1, wherein the amines are 1,2-propanediamine and/or 1,3-propanediamine.
3. The liquid cleaning composition according to Item 1, wherein the azoles are one or more selected from the group consisting of 1-methylimidazole, 1-vinylimidazole, 2-phenylimidazole, 2-ethyl-4-methylimidazole, N-benzyl-2-methylimidazole, 2-methylbenzimidazole, pyrazole, 4-methylpyrazole, 3,5-dimethylpyrazole, 1,2,4-triazole, 1H-benzotriazole, 5-methyl-1H-benzotriazole and 1H-tetrazole.
4. The liquid cleaning composition according to Item 1, wherein the aminopolymethylene phosphonic acid is one or more selected from the group consisting of amino tri(methylene phosphonic acid), ethylenediamine tetra(methylene phosphonic acid), diethylenetriamine penta(methylene phosphonic acid) and 1,2-propylenediamine tetra(methylene phosphonic acid).
5. A cleaning method for removing, using a liquid cleaning composition, a hard mask and a dry etch residue in a semiconductor device provided with a low-dielectric-constant interlayer dielectric film, the hard mask and cobalt or a cobalt alloy while suppressing damage to the low-dielectric-constant interlayer dielectric film and the cobalt or the cobalt alloy, the method comprising the step of bringing the liquid cleaning composition comprising hydrogen peroxide at 10-30% by mass, potassium hydroxide at 0.005-0.7% by mass, aminopolymethylene phosphonic acid at 0.00001-0.01% by mass, at least one selected from amines and azoles at 0.001-5% by mass and water into contact with the semiconductor device.
6. The cleaning method according to Item 5, wherein the amines are 1,2-propanediamine and/or 1,3-propanediamine.
7. The cleaning method according to Item 5, wherein the azoles are one or more selected from the group consisting of 1-methylimidazole, 1-vinylimidazole, 2-phenylimidazole, 2-ethyl-4-methylimidazole, N-benzyl-2-methylimidazole, 2-methylbenzimidazole, pyrazole, 4-methylpyrazole, 3,5-dimethylpyrazole, 1,2,4-triazole, 1H-benzotriazole, 5-methyl-1H-benzotriazole and 1H-tetrazole.

8. The cleaning method according to Item 5, wherein the aminopolymethylene phosphonic acid is one or more selected from the group consisting of amino tri(methylene phosphonic acid), ethylenediamine tetra(methylene phosphonic acid), diethylenetriamine penta(methylene phosphonic acid) and 1,2-propylenediamine tetra(methylene phosphonic acid).

Effect of the Invention

By using the liquid cleaning composition and the cleaning method of the present invention, the hard mask and the dry etch residue on the surface to be processed can be removed while suppressing damage to the low-dielectric-constant interlayer dielectric film, the metal wiring, the barrier metal and the barrier dielectric film in the process of fabricating a semiconductor device, thereby fabricating a high-precision high-quality semiconductor device at good yield.

MODES FOR CARRYING OUT THE INVENTION

A liquid cleaning composition of the present invention (hereinafter, sometimes simply referred to as a "cleaning solution") contains hydrogen peroxide, potassium hydroxide, aminopolymethylene phosphonic acid, at least one selected from amines and azoles, and water.

The liquid composition of the present invention for cleaning a hard mask and a dry etch residue is used during the process of fabricating a semiconductor device, and thus it must suppress damage to a low-dielectric-constant interlayer dielectric film, metal wiring, a barrier metal and a barrier dielectric film.

The concentration range of hydrogen peroxide used with the present invention is 10-30% by mass, preferably 13-25% by mass and particularly preferably 15-20% by mass. When the concentration range of hydrogen peroxide is 10-30% by mass, the hard mask, the dry etch residue and the photoresist can be removed effectively while suppressing damage to the metal wiring and the barrier metal.

The concentration range of potassium hydroxide used with the present invention is 0.005-0.7% by mass, preferably 0.01-0.5% by mass and particularly preferably 0.02-0.4% by mass. When the concentration range of potassium hydroxide is 0.005-0.7% by mass, the hard mask and the dry etch residue can be removed effectively while suppressing damage to the low-dielectric-constant interlayer dielectric film and the metal wiring.

Examples of aminopolymethylene phosphonic acid used with the present invention include amino tri(methylene phosphonic acid), ethylenediamine tetra(methylene phosphonic acid), diethylenetriamine penta(methylene phosphonic acid) and 1,2-propylenediamine tetra(methylene phosphonic acid). These aminopolymethylene phosphonic acids may be used alone or two or more types of them may be used in combination.

The concentration range of the above-mentioned aminopolymethylene phosphonic acid used with the present invention is 0.00001-0.01% by mass, preferably 0.00005-0.007% by mass and particularly preferably 0.0001-0.005% by mass. When the concentration range of aminopolymethylene phosphonic acid is 0.00001-0.01% by mass, decomposition of hydrogen peroxide as well as damage to the metal wiring can be suppressed.

The amines used with the present invention are preferably 1,2-propanediamine and/or 1,3-propanediamine.

The concentration range of said amines is 0.001-5% by mass, preferably 0.01-4% by mass and particularly preferably 0.05-3% by mass. When the concentration range of the amines is within a range of 0.001-5% by mass, damage to the metal wiring can be suppressed.

The azoles used with the present invention are, but not limited to, one or more selected from the group consisting of 1-methylimidazole, 1-vinylimidazole, 2-phenylimidazole, 2-ethyl-4-methylimidazole, N-benzyl-2-methylimidazole, 2-methylbenzimidazole, pyrazole, 4-methylpyrazole, 3,5-dimethylpyrazole, 1,2,4-triazole, 1H-benzotriazole, 5-methyl-1H-benzotriazole and 1H-tetrazole.

The above-mentioned amines and azoles used with the present invention may be used alone or two or more types of them may be used in combination. The concentration range of azoles is 0.001-5% by mass, preferably 0.01-4% by mass and particularly preferably 0.05-3% by mass. When the concentration of the azoles is within the above-mentioned range, damage to the metal wiring can be suppressed.

If desired, the liquid cleaning composition of the present invention may be added with an additive that is conventionally used in a liquid composition for cleaning a semiconductor as long as the purpose of the present invention is not interfered. For example, a surfactant, an antifoaming agent or the like may be added as such additive.

The cleaning method of the present invention is a method for removing, using a liquid cleaning composition, a hard mask and a dry etch residue in a semiconductor device provided with a low-dielectric-constant interlayer dielectric film, the hard mask and cobalt or a cobalt alloy while suppressing damage to the low-dielectric-constant interlayer dielectric film and the cobalt or the cobalt alloy, the method comprising the step of bringing the liquid cleaning composition comprising hydrogen peroxide at 10-30% by mass, potassium hydroxide at 0.005-0.7% by mass, aminopolymethylene phosphonic acid at 0.00001-0.01% by mass, at least one selected from amines and azoles at 0.001-5% by mass, and water into contact with the semiconductor device. The method for bringing the liquid cleaning composition of the present invention into contact with the semiconductor device is not particularly limited. For example, a method in which the semiconductor device is immersed in the liquid cleaning composition of the present invention or a method in which the semiconductor device is brought into contact with the liquid cleaning composition by dropping, spraying or the like may be employed.

The temperature of the liquid cleaning composition of the present invention upon use is preferably 20-80° C. and more preferably in a range of 25-70° C., which may suitably be selected according to etch conditions and a semiconductor base to be used. If necessary, the cleaning method of the present invention may also employ ultrasonication in combination. The time to use the liquid cleaning composition of the present invention is preferably 0.3-20 minutes and particularly preferably in a range of 0.5-10 minutes, which may suitably be selected according to etch conditions and a semiconductor base to be used. Although a rinsing liquid after the usage of the liquid cleaning composition of the present invention may be an organic solvent such as alcohol, simply rinsing with water is also sufficient.

In general, a semiconductor device and a display element includes: a substrate material such as silicon, amorphous silicon, polysilicon or glass; an dielectric material such as silicon oxide, silicon nitride, silicon carbide or a derivative thereof; a barrier material such as tantalum, tantalum nitride, ruthenium or ruthenium oxide; a wiring material such as copper or a copper alloy; a compound semiconductor such as gallium-arsenic, gallium-phosphorus, indium-phosphorus, indium-gallium-arsenic or indium-aluminum-arsenic; and an oxide semiconductor such as chrome oxide.

In general, as a low-dielectric-constant interlayer dielectric film, OCD (trade name, Tokyo Ohka Kogyo) of a hydroxysilsesquioxane (HSQ) series or a methylsilsesquioxane (MSQ) series, Black Diamond (trade name, Applied Materials), Aurora (trade name, ASM International) or Coral (trade name, Novellus Systems) of a carbon-doped silicon oxide (SiOC) series or the like may be used, although the low-dielectric-constant interlayer dielectric film is not limited thereto.

In general, as a barrier metal, tantalum, tantalum nitride, ruthenium, manganese, magnesium, cobalt or an oxide thereof may be used, although the barrier metal is not limited thereto.

In general, as a barrier dielectric film, silicon nitride, silicon carbide, silicon carbonitride or the like may be used, although the barrier dielectric film is not limited thereto.

As a hard mask to which the present invention can be applied, titanium nitride, titanium or the like may be used.

As metal wiring to which the present invention can be applied, cobalt or a cobalt alloy formed on copper or a copper alloy, cobalt or a cobalt alloy, or the like may be used.

When cobalt or a cobalt alloy formed on copper or a copper alloy is used as the metal wiring, the copper or the copper alloy usually does not make contact with the cleaning solution since the copper or the copper alloy are completely covered by the cobalt or the cobalt alloy. If, however, there is even a slight defect in the cobalt or the cobalt alloy, the liquid cleaning composition will make contact with the copper or the copper alloy. Therefore, the liquid cleaning composition intended for the present invention needs to have an anticorrosion property against copper or a copper alloy. Since the liquid cleaning composition of the present invention has an anticorrosion property against copper or a copper alloy, it can be used for metal wiring which has cobalt or a cobalt alloy formed on copper or a copper alloy.

A semiconductor device that is to be cleaned with the liquid cleaning composition of the present invention is not particularly limited as long as it is provided with a low-dielectric-constant interlayer dielectric film, a hard mask and cobalt or a cobalt alloy. For example, the liquid cleaning composition of the present invention can be used for cleaning a semiconductor device obtained by: laminating a barrier dielectric film, a low-dielectric-constant interlayer dielectric film, a hard mask and a photoresist on a substrate having a barrier metal, metal wiring and a low-dielectric-constant interlayer dielectric film or a substrate having metal wiring and a low-dielectric-constant interlayer dielectric film; then subjecting the photoresist to selective exposure followed by development to form a photoresist pattern; and subjecting the hard mask, the low-dielectric-constant interlayer dielectric film and the barrier dielectric film laminated on the substrate to a dry etch treatment using this photoresist pattern as a mask.

Figure 1:
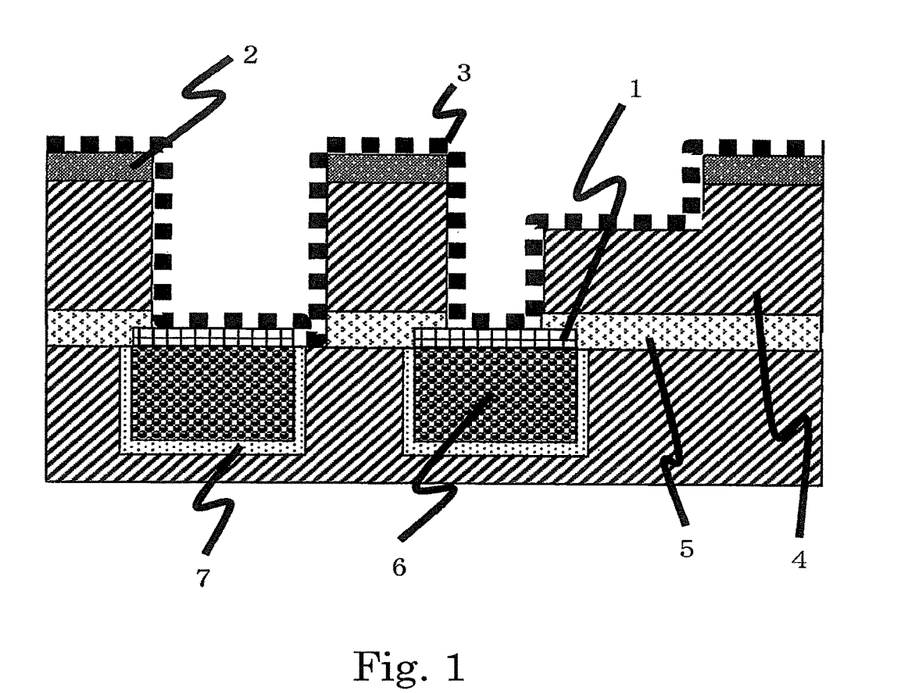
FIG. 1 A cross-sectional view of one exemplary wiring structure (pattern 1) of a semiconductor device that is to be cleaned with a liquid cleaning composition of the present invention.
Figure 2:
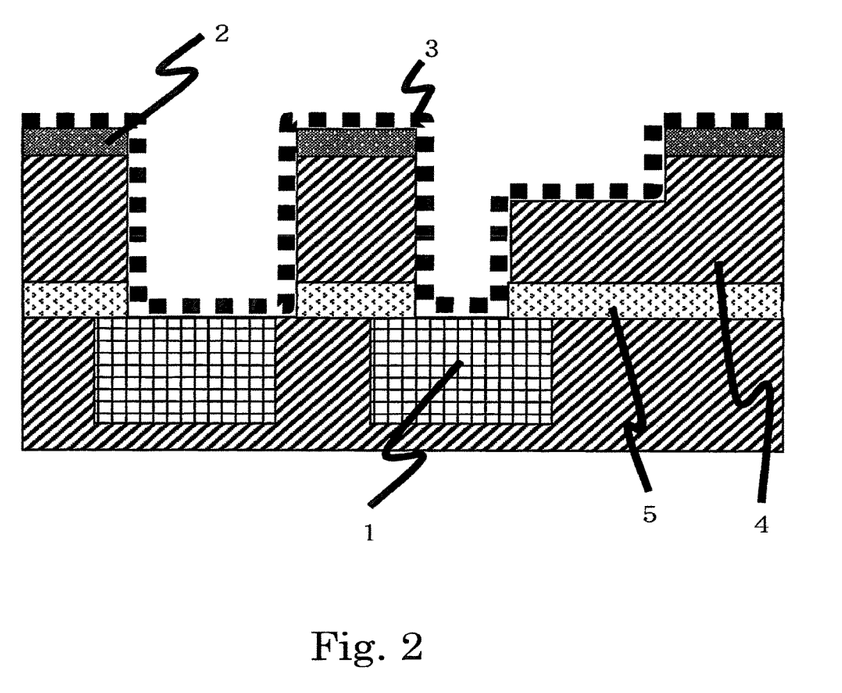
FIG. 2 A cross-sectional view of one exemplary wiring structure (pattern 2) of a semiconductor device that is to be cleaned with a liquid cleaning composition of the present invention.

Examples of such a semiconductor device include semiconductor devices having wiring structures with the cross-sections shown in FIGS. 1 and 2. In FIG. 1, a barrier dielectric film 5, a low-dielectric-constant interlayer dielectric film 4 and a hard mask 2 are laminated on a substrate including a barrier metal 7, metal wiring having cobalt or a cobalt alloy 1 formed on copper or a copper alloy 6 and a low-dielectric-constant interlayer dielectric film 4, where a predetermined pattern is formed. A dry etch residue 3 is attached to the surface of the semiconductor device. The wiring structure shown in FIG. 2 is the same as FIG. 1 except that cobalt or a cobalt alloy 1 is used as the metal wiring. In a preferable embodiment of the present invention, the liquid cleaning composition of the present invention can be used to clean such a semiconductor device to remove the hard mask and the dry etch residue while suppressing damage to the low-dielectric-constant interlayer dielectric film, the metal wiring, the barrier metal and the barrier dielectric film.

EXAMPLES

Hereinafter, the present invention will be described more specifically by means of Examples and Comparative Examples. The present invention, however, should not be limited by these examples in any way.

<Method and Device for Assessing Removal States and Damage of Materials>

The removal states of the hard mask and/or the dry etch residue from the substrate as well as damages to the low-dielectric-constant interlayer dielectric film and the cobalt or the cobalt alloy were assessed by SEM observation. A SEM instrument used was ultrahigh-resolution field emission type scanning electron microscope SU9000 from Hitachi High-Technologies Corporation.

<Method for Assessing Stability of Hydrogen Peroxide>

The liquid cleaning compositions shown in Tables 1 and 3 were heated in a constant-temperature water tank at 70° C. for 24 hours and the concentrations of the hydrogen peroxide in the liquid cleaning compositions before and after the heating were determined by potentiometric titration (using potassium permanganate), thereby calculating the rates of hydrogen peroxide decomposition.

Rate of hydrogen peroxide decomposition=100−((Weight of liquid cleaning composition after heating)×(Concentration of hydrogen peroxide after heating)/(Weight of liquid cleaning composition before heating)×(Concentration of hydrogen peroxide before heating)×100)

Judgments

I. Removal State of Hard Mask 2
  E: Hard mask was completely removed.
  G: Hard mask was mostly removed.
  P: Hard mask was not removed.
  E and G were considered to be acceptable.

II. Removal State of Dry Etch Residue 3
  E: Dry etch residue was completely removed.
  G: Dry etch residue was mostly removed.
  P: Dry etch residue was not removed.
  E and G were considered to be acceptable.

III. Damage to Cobalt or Cobalt Alloy 1
  E: No change was seen in cobalt or cobalt alloy compared to them before cleaning.
  G: A little roughness was seen in surface of cobalt or cobalt alloy.

P: Large hole was seen in cobalt or cobalt alloy.
E and G were considered to be acceptable.

IV. Damage to Low-Dielectric-Constant Interlayer Dielectric Film 4

E: No change was seen in low-dielectric-constant interlayer dielectric film compared to it before cleaning.

G: Slight recess was found in low-dielectric-constant interlayer dielectric film.

P: Large recess was found in low-dielectric-constant interlayer dielectric film.

E and G were considered to be acceptable.

V. Stability of Hydrogen Peroxide

E1: Rate of hydrogen peroxide decomposition was less than 5%

G: Rate of hydrogen peroxide decomposition was 5% or more and less than 10%

P: Rate of hydrogen peroxide decomposition was 10% or more and less than 20%

F: Rate of hydrogen peroxide decomposition was 20% or more

E2: Liquid cleaning composition did not contain hydrogen peroxide.

E1, G and E2 were considered to be acceptable.

Examples 1-29

Semiconductor devices having a wiring structure with the cross-section shown in FIG. 1 or 2 were used for the test. In order to remove the hard masks 2 and the dry etch residues 3, the semiconductor devices were immersed in the liquid cleaning compositions indicated in Table 1 at temperatures and for time indicated in Table 2. Then, the devices were rinsed with ultrapure water and dried with dry nitrogen gas jet. The semiconductor devices after washing were observed with SEM to assess the removal states of the hard masks 2 and the dry etch residues 3 as well as damage to the cobalt or the cobalt alloys 1, the low-dielectric-constant interlayer dielectric films 4, the barrier dielectric films 5 and the barrier metals 7. In addition, stability of hydrogen peroxide was also examined.

In Examples 1-29 in which the liquid cleaning compositions of the present invention indicated in Table 2 were applied, the hard masks 2 and the dry etch residues 3 were found to be removed while damage to the cobalt or the cobalt alloys 1 and the low-dielectric-constant interlayer dielectric films 4 were found to be prevented. In all examples, no damage to the barrier dielectric films 5, the copper or the copper alloys 6 and the barrier metals 7 were observed. In addition, the rates of hydrogen peroxide decomposition were less than 10%.

Comparative Example 1

A semiconductor device shown in FIG. 1 was cleaned with an aqueous solution described in Patent Document 2 containing hydrogen peroxide at 15% by mass, potassium hydroxide at 0.02% by mass, 1,2-propylenediamine tetra (methylene phosphonic acid) at 0.0005% by mass and water at 84.9795% by mass (Table 3, cleaning solution 3A). The cleaning conditions and the assessment results are shown in Table 4. Although the hard mask 2 and the dry etch residue 3 were removed, damage to the low-dielectric-constant interlayer dielectric film 4 was prevented and the rate of hydrogen peroxide decomposition was low, a large hole was found in the cobalt or the cobalt alloy 1.

Comparative Example 2

A semiconductor device shown in FIG. 1 was cleaned with an aqueous solution described in Patent Document 3 containing hydrogen peroxide at 0.35% by mass, 2-(2-aminoethylamino)ethanol at 2.0% by mass, tetramethylammonium hydroxide at 1.5% by mass, ethylenediamine tetraacetic acid at 1.2% by mass and water at 94.95% by mass (Table 3, cleaning solution 3B). The cleaning conditions and the assessment results are shown in Table 4. Although the rate of hydrogen peroxide decomposition was low, the hard mask 2 and the dry etch residue 3 were not removed and damage to the low-dielectric-constant interlayer dielectric film 4 was not prevented.

Comparative Example 3

A semiconductor device shown in FIG. 1 was cleaned with an aqueous solution described in Patent Document 4 containing hydrogen peroxide at 3% by mass, potassium hydroxide at 2% by mass, sulfolane at 70% by mass, diethylenetriamine penta(methylene phosphonic acid) at 1% by mass and water at 24% by mass (Table 3, cleaning solution 3C). The cleaning conditions and the assessment results are shown in Table 4. The rate of hydrogen peroxide decomposition was high, the hard mask 2 and the dry etch residue 3 were not removed and damage to the low-dielectric-constant interlayer dielectric film 4 was not prevented.

Comparative Example 4

A semiconductor device shown in FIG. 1 was cleaned with an aqueous solution described in Patent Document 5 containing sulfuric acid at 98% by mass and water at 2% by mass (Table 3, cleaning solution 3D). The cleaning conditions and the assessment results are shown in Table 4. Although the dry etch residue 3 was removed and damage to the low-dielectric-constant interlayer dielectric film 4 was prevented, the hard mask 2 was not removed and a large hole was found in the cobalt or the cobalt alloy 1.

The cleaning solutions described in Patent Documents 2-5 (Comparative Examples 1-4) were found that they cannot be used as a cleaning solution for removing a hard mask and a dry etch residue while preventing damage to cobalt or a cobalt alloy and a low-dielectric-constant interlayer dielectric film since cleaning performance was insufficient, the cobalt or the cobalt alloy or the low-dielectric-constant interlayer dielectric film was damaged, or stability of the cleaning solution was poor (Table 4).

Comparative Example 5

A semiconductor device shown in FIG. 1 was cleaned with an aqueous solution containing hydrogen peroxide at 17% by mass, potassium hydroxide at 0.2% by mass, diethylenetriamine penta(methylene phosphonic acid) at 0.0005% by mass and water at 82.7995% by mass (Table 3, cleaning solution 3E). The cleaning conditions and the assessment results are shown in Table 4. Although the rate of hydrogen peroxide decomposition was low, the hard mask 2 and the dry etch residue 3 were removed and damage to the low-dielectric-constant interlayer dielectric film 4 was prevented, a large hole was found in the cobalt or the cobalt alloy 1.

Comparative Example 6

A semiconductor device shown in FIG. 1 was cleaned with an aqueous solution containing potassium hydroxide at 0.2% by mass, 1H-tetrazole at 0.5% by mass, diethylenetriamine penta(methylene phosphonic acid) at 0.0005% by mass and water at 99.2995% by mass (Table 3, cleaning solution 3F). The cleaning conditions and the assessment results are shown in Table 4. The hard mask 2 and the dry etch residue 3 were not removed, and damage to the cobalt or a cobalt alloy and the low-dielectric-constant interlayer dielectric film 4 was not prevented.

Comparative Example 7

A semiconductor device shown in FIG. 1 was cleaned with an aqueous solution containing hydrogen peroxide at 17% by mass, 1H-tetrazole at 0.5% by mass, diethylenetriamine penta(methylene phosphonic acid) at 0.0005% by mass and water at 82.4995% by mass (Table 3, cleaning solution 3F). The cleaning conditions and the assessment results are shown in Table 4. Although the rate of hydrogen peroxide decomposition was low and damage to the low-dielectric-constant interlayer dielectric film 4 was prevented, the hard mask 2 and the dry etch residue 3 were not removed and damage to the cobalt or the cobalt alloy 1 was not prevented.

Comparative Example 8

A semiconductor device shown in FIG. 1 was cleaned with an aqueous solution containing hydrogen peroxide at 17% by mass, potassium hydroxide at 0.2% by mass, 1H-tetrazole at 0.5% by mass and water at 82.3% by mass (Table 3, cleaning solution 3H). The cleaning conditions and the assessment results are shown in Table 4. Although the hard mask 2 and the dry etch residue 3 were removed and damage to the cobalt or the cobalt alloy 1 and the low-dielectric-constant interlayer dielectric film 4 was prevented, the rate of hydrogen peroxide decomposition was high.

Comparative Example 9

A semiconductor device shown in FIG. 1 was cleaned with an aqueous solution containing hydrogen peroxide at 17% by mass, potassium hydroxide at 0.2% by mass, 1H-tetrazole at 0.5% by mass, ethylenediamine tetraacetic acid at 1.2% by mass and water at 81.1% by mass (Table 3, cleaning solution 3I). The cleaning conditions and the assessment results are shown in Table 4. Although the hard mask 2 and the dry etch residue 3 were removed and damage to the cobalt or the cobalt alloy 1 and the low-dielectric-constant interlayer dielectric film 4 was prevented, the rate of hydrogen peroxide decomposition was high.

Comparative Example 10

A semiconductor device shown in FIG. 1 was cleaned with an aqueous solution containing hydrogen peroxide at 17% by mass, potassium hydroxide at 0.2% by mass, 1H-tetrazole at 0.5% by mass, diethylenetriamine pentaacetic acid at 1.2% by mass and water at 81.1% by mass (Table 3, cleaning solution 3J). The cleaning conditions and the assessment results are shown in Table 4. Although the hard mask 2 and the dry etch residue 3 were removed and damage to the cobalt or the cobalt alloy 1 and the low-dielectric-constant interlayer dielectric film 4 was prevented, the rate of hydrogen peroxide decomposition was high.

Comparative Example 11

A semiconductor device shown in FIG. 1 was cleaned with an aqueous solution containing hydrogen peroxide at 17% by mass, potassium hydroxide at 0.2% by mass, 1H-tetrazole at 0.5% by mass, triethylenetetramine at 1.2% by mass and water at 81.1% by mass (Table 3, cleaning solution 3K). The cleaning conditions and the assessment results are shown in Table 4. Although the hard mask 2 and the dry etch residue 3 were removed and damage to the cobalt or the cobalt alloy 1 and the low-dielectric-constant interlayer dielectric film 4 was prevented, the rate of hydrogen peroxide decomposition was high.

Comparative Example 12

A semiconductor device shown in FIG. 1 was cleaned with an aqueous solution containing hydrogen peroxide at 17% by mass, potassium hydroxide at 0.2% by mass, 1H-tetrazole at 0.5% by mass, tetraethylenepentamine at 1.2% by mass and water at 81.1% by mass (Table 3, cleaning solution 3L). The cleaning conditions and the assessment results are shown in Table 4. Although the hard mask 2 and the dry etch residue 3 were removed and damage to the cobalt or the cobalt alloy 1 and the low-dielectric-constant interlayer dielectric film 4 was prevented, the rate of hydrogen peroxide decomposition was high.

Comparative Example 13

A semiconductor device shown in FIG. 1 was cleaned with an aqueous solution containing hydrogen peroxide at 17% by mass, potassium hydroxide at 0.2% by mass, 1H-tetrazole at 0.5% by mass, pentaethylenehexamine at 1.2% by mass and water at 81.1% by mass (Table 3, cleaning solution 3M). The cleaning conditions and the assessment results are shown in Table 4. Although the hard mask 2 and the dry etch residue 3 were removed and damage to the cobalt or the cobalt alloy 1 and the low-dielectric-constant interlayer dielectric film 4 was prevented, the rate of hydrogen peroxide decomposition was high.

Comparative Example 14

A semiconductor device shown in FIG. 1 was cleaned with an aqueous solution containing hydrogen peroxide at 17% by mass, potassium hydroxide at 0.2% by mass, 1H-tetrazole at 0.5% by mass, 1,4,7,10-tetraazacyclododecane at 1.2% by mass and water at 81.1% (Table 3, cleaning solution 3N). The cleaning conditions and the assessment results are shown in Table 4. Although the hard mask 2 and the dry etch residue 3 were removed and damage to the cobalt or the cobalt alloy 1 and the low-dielectric-constant interlayer dielectric film 4 was prevented, the rate of hydrogen peroxide decomposition was high.

Comparative Example 15

A semiconductor device shown in FIG. 1 was cleaned with an aqueous solution containing hydrogen peroxide at 17% by mass, potassium hydroxide at 0.2% by mass, 1H-tetrazole at 0.5% by mass, 8-quinolinol at 1.2% by mass and water at 81.1% by mass (Table 3, cleaning solution 3O). The cleaning conditions and the assessment results are shown in Table 4. Although the hard mask 2 and the dry etch residue 3 were removed, and damage to the cobalt or the cobalt alloy 1 and the low-dielectric-constant interlayer dielectric film 4 was prevented, the rate of hydrogen peroxide decomposition was high.

Comparative Example 16

A semiconductor device shown in FIG. 1 was cleaned with an aqueous solution containing hydrogen peroxide at 17% by mass, potassium hydroxide at 0.2% by mass, 1H-tetrazole at 0.5% by mass, 8-hydroxyquinaldine at 1.2% by mass and water at 81.1% by mass (Table 3, cleaning solution 3P). The cleaning conditions and the assessment results are shown in Table 4. Although the hard mask 2 and the dry etch residue 3 were removed and damage to the cobalt or the cobalt alloy 1 and the low-dielectric-constant interlayer dielectric film 4 was prevented, the rate of hydrogen peroxide decomposition was high.

Comparative Example 17

A semiconductor device shown in FIG. 1 was cleaned with an aqueous solution containing hydrogen peroxide at 17% by mass, potassium hydroxide at 0.2% by mass, 1H-tetrazole at 0.5% by mass, 2,2'-azodiphenol at 1.2% by mass and water at 81.1% by mass (Table 3, cleaning solution 3Q). The cleaning conditions and the assessment results are shown in Table 4. Although the hard mask 2 and the dry etch residue 3 were removed and damage to the cobalt or the cobalt alloy 1 and the low-dielectric-constant interlayer dielectric film 4 was prevented, the rate of hydrogen peroxide decomposition was high.

Comparative Example 18

A semiconductor device shown in FIG. 1 was cleaned with an aqueous solution containing hydrogen peroxide at 17% by mass, potassium hydroxide at 0.2% by mass, 1H-tetrazole at 0.5% by mass, phosphonic acid at 0.0005% by mass and water at 82.2995% by mass (Table 3, cleaning solution 3R). The cleaning conditions and the assessment results are shown in Table 4. Although the hard mask 2 and the dry etch residue 3 were removed and damage to the cobalt or the cobalt alloy 1 and the low-dielectric-constant interlayer dielectric film 4 was prevented, the rate of hydrogen peroxide decomposition was high.

Comparative Example 19

A semiconductor device shown in FIG. 1 was cleaned with an aqueous solution containing hydrogen peroxide at 17% by mass, potassium hydroxide at 0.2% by mass, ethylenediamine at 0.5% by mass, diethylenetriamine penta(methylene phosphonic acid) at 0.005% by mass and water at 82.2995% by mass (Table 3, cleaning solution 3S). The cleaning conditions and the assessment results are shown in Table 4. Although the rate of hydrogen peroxide decomposition was low, the hard mask 2 and the dry etch residue 3 were removed and damage to the low-dielectric-constant interlayer dielectric film 4 was prevented, a large hole was found in the cobalt or the cobalt alloy 1.

Comparative Example 20

A semiconductor device shown in FIG. 1 was cleaned with an aqueous solution containing hydrogen peroxide at 17% by mass, potassium hydroxide at 0.2% by mass, ethanolamine at 0.5% by mass, diethylenetriamine penta(methylene phosphonic acid) at 0.005% by mass and water at 82.2995% by mass (Table 3, cleaning solution 3T). The cleaning conditions and the assessment results are shown in Table 4. Although the rate of hydrogen peroxide decomposition was low, the hard mask 2 and the dry etch residue 3 were removed and damage to the low-dielectric-constant interlayer dielectric film 4 was prevented, a large hole was found in the cobalt or the cobalt alloy 1.

TABLE 1

| Cleaning solution | Hydrogen peroxide Concentration % by mass | Potassium hydroxide Concentration % by mass | Amino polymethylene phosphonic acid Type | Concentration % by mass | Amines or azoles Type | Concentration % by mass | Water Concentration % by mass |
|---|---|---|---|---|---|---|---|
| 1A | 17 | 0.02 | 1,2-Propylenediamine tetra(methylene phosphonic acid) | 0.0005 | 3,5-Dimethylpyrazole | 3 | 79.9795 |
| 1B | 17 | 0.02 | 1,2-Propylenediamine tetra(methylene phosphonic acid) | 0.0005 | 1,2,4-Triazole | 4 | 78.9795 |
| 1C | 17 | 0.2 | 1,2-Propylenediamine tetra(methylene phosphonic acid) | 0.0005 | 2-Ethyl-4-methylimidazole | 0.05 | 82.7495 |
| 1D | 17 | 0.2 | 1,2-Propylenediamine tetra(methylene phosphonic acid) | 0.0005 | 3,5-Dimethylpyrazole | 0.01 | 82.7895 |
| 1E | 15 | 0.4 | 1,2-Propylenediamine tetra(methylene phosphonic acid) | 0.0005 | 1,2,4-Triazole | 0.5 | 83.9995 |
| 1F | 13 | 0.5 | 1,2-Propylenediamine tetra(methylene phosphonic acid) | 0.0005 | 3,5-Dimethylpyrazole | 0.1 | 86.3995 |
| 1G | 20 | 0.02 | 1,2-Propylenediamine tetra(methylene phosphonic acid) | 0.0005 | 3,5-Dimethylpyrazole | 0.5 | 79.4795 |
| 1H | 25 | 0.01 | 1,2-Propylenediamine tetra(methylene phosphonic acid) | 0.0005 | 1,2,4-Triazole | 0.5 | 74.4895 |
| 1I | 17 | 0.2 | Diethylenetriamine penta(methylene phosphonic acid) | 0.005 | 2-Ethyl-4-methylimidazole | 0.5 | 82.295 |
| 1J | 17 | 0.2 | Diethylenetriamine penta(methylene phosphonic acid) | 0.007 | 3,5-Dimethylpyrazole | 0.5 | 82.293 |
| 1K | 17 | 0.2 | Diethylenetriamine penta(methylene phosphonic acid) | 0.0001 | 1,2,4-Triazole | 0.5 | 82.2999 |
| 1L | 17 | 0.2 | Diethylenetriamine penta(methylene phosphonic acid) | 0.00005 | 2-Ethyl-4-methylimidazole | 0.5 | 82.29995 |
| 1M | 17 | 0.2 | Diethylenetriamine penta(methylene phosphonic acid) | 0.0005 | 1,2-Propanediamine | 0.1 | 82.2995 |
| 1N | 17 | 0.2 | Diethylenetriamine penta(methylene phosphonic acid) | 0.0005 | 1,3-Propanediamine | 0.1 | 82.2995 |
| 1O | 17 | 0.2 | Diethylenetriamine penta(methylene phosphonic acid) | 0.0005 | 1-Methylimidazole | 0.5 | 82.2995 |

TABLE 1-continued

| Cleaning solution | Hydrogen peroxide Concentration % by mass | Potassium hydroxide Concentration % by mass | Amino polymethylene phosphonic acid Type | Concentration % by mass | Amines or azoles Type | Concentration % by mass | Water Concentration % by mass |
|---|---|---|---|---|---|---|---|
| 1P | 17 | 0.2 | Diethylenetriamine penta(methylene phosphonic acid) | 0.0005 | 1-Vinylimidazole | 0.5 | 82.2995 |
| 1Q | 17 | 0.2 | Diethylenetriamine penta(methylene phosphonic acid) | 0.0005 | 2-Phenylimidazole | 0.5 | 82.2995 |
| 1R | 17 | 0.2 | Diethylenetriamine penta(methylene phosphonic acid) | 0.0005 | 2-Ethyl-4-methylimidazole | 0.5 | 82.2995 |
| 1S | 17 | 0.2 | Diethylenetriamine penta(methylene phosphonic acid) | 0.0005 | N-Benzyl-2-methylimidazole | 0.5 | 82.2995 |
| 1T | 17 | 0.2 | Diethylenetriamine penta(methylene phosphonic acid) | 0.0005 | 2-Methylbenzimidazole | 0.5 | 82.2995 |
| 1U | 17 | 0.2 | Diethylenetriamine penta(methylene phosphonic acid) | 0.0005 | Pyrazole | 0.5 | 82.2995 |
| 1V | 17 | 0.2 | Diethylenetriamine penta(methylene phosphonic acid) | 0.0005 | 4-Methylpyrazole | 0.5 | 82.2995 |
| 1W | 17 | 0.2 | Diethylenetriamine penta(methylene phosphonic acid) | 0.0005 | 3,5-Dimethylpyrazole | 0.5 | 82.2995 |
| 1X | 17 | 0.2 | Diethylenetriamine penta(methylene phosphonic acid) | 0.0005 | 1,2,4-Triazole | 0.5 | 82.2995 |
| 1Y | 17 | 0.2 | Diethylenetriamine penta(methylene phosphonic acid) | 0.0005 | 1H-Benzotriazole | 0.5 | 82.2995 |
| 1Z | 17 | 0.2 | Diethylenetriamine penta(methylene phosphonic acid) | 0.0005 | 5-Methyl-1H-benzotriazole | 0.5 | 82.2995 |
| 1AA | 17 | 0.2 | Diethylenetriamine penta(methylene phosphonic acid) | 0.0005 | 1H-tetrazole | 0.5 | 82.2995 |
| 1AB | 17 | 0.2 | Amino tri(methylene phosphonic acid) | 0.0005 | 2-Ethyl-4-methylimidazole | 0.5 | 82.2995 |
| 1AC | 17 | 0.2 | Ethylenediamine tetra(methylene phosphonic acid) | 0.0005 | 3,5-Dimethylpyrazole | 0.5 | 82.2995 |

TABLE 2

| Example | Cleaning solution | Semiconductor device | Temperature/°C. | Immersion time/min | Removal state I | Removal state II | Damage III | Damage IV | Stability V |
|---|---|---|---|---|---|---|---|---|---|
| 1 | 1A | FIG. 1 | 50 | 3 | E | E | E | E | E |
| 2 | 1B | FIG. 1 | 50 | 3 | E | E | G | E | E |
| 3 | 1C | FIG. 1 | 50 | 3 | E | E | E | E | E |
| 4 | 1D | FIG. 1 | 50 | 3 | E | E | G | E | E |
| 5 | 1E | FIG. 1 | 50 | 3 | E | E | E | E | E |
| 6 | 1F | FIG. 1 | 70 | 10 | G | E | E | E | E |
| 7 | 1G | FIG. 1 | 50 | 1 | E | E | E | E | E |
| 8 | 1H | FIG. 1 | 25 | 0.5 | G | G | E | G | E |
| 9 | 1I | FIG. 1 | 50 | 3 | E | E | E | E | E |
| 10 | 1J | FIG. 1 | 50 | 3 | E | E | G | E | E |
| 11 | 1K | FIG. 1 | 50 | 3 | E | E | E | E | E |
| 12 | 1L | FIG. 1 | 50 | 3 | E | E | E | E | G |
| 13 | 1M | FIG. 1 | 50 | 3 | E | E | E | E | E |
| 14 | 1N | FIG. 1 | 50 | 3 | E | E | E | E | E |
| 15 | 1O | FIG. 1 | 50 | 3 | E | E | E | E | E |
| 16 | 1P | FIG. 1 | 50 | 3 | E | E | E | E | E |
| 17 | 1Q | FIG. 1 | 50 | 3 | E | E | E | E | E |
| 18 | 1R | FIG. 2 | 50 | 3 | E | E | E | E | E |
| 19 | 1S | FIG. 1 | 50 | 3 | E | E | E | E | E |
| 20 | 1T | FIG. 1 | 50 | 3 | E | E | E | E | E |
| 21 | 1U | FIG. 1 | 50 | 3 | E | E | E | E | E |
| 22 | 1V | FIG. 1 | 50 | 3 | E | E | E | E | E |
| 23 | 1W | FIG. 2 | 50 | 3 | E | E | E | E | E |
| 24 | 1X | FIG. 2 | 50 | 3 | E | E | E | E | E |
| 25 | 1Y | FIG. 1 | 50 | 3 | E | E | E | E | E |
| 26 | 1Z | FIG. 1 | 50 | 3 | E | E | E | E | E |
| 27 | 1AA | FIG. 1 | 50 | 3 | E | E | E | E | E |
| 28 | 1AB | FIG. 1 | 50 | 3 | E | E | E | E | E |
| 29 | 1AC | FIG. 1 | 50 | 3 | E | E | E | E | E |

Removal state I: Removal state of hard mask 2
Removal state II: Removal state of dry etch residue 3
Damage III: Damage to cobalt or cobalt alloy 1
Damage VI: Damage to low-dielectric-constant interlayer dielectric film 4
Stability V: Stability of hydrogen peroxide

TABLE 3

| Cleaning solution | Composition of cleaning solution (concentration: % by mass) |
|---|---|
| 3A | Hydrogen peroxide 15%, potassium hydroxide 0.02%, 1,2-propylenediamine tetra(methylene phosphonic acid) 0.0005%, water 84.9795% |
| 3B | Hydrogen peroxide 0.35%, 2-(2-aminoethylamino)ethanol 2.0%, tetramethylammonium hydroxide 1.5%, ethylenediamine tetraacetic acid 1.2%, water 94.95% |
| 3C | Hydrogen peroxide 3%, potassium hydroxide 2%, sulfolane 70%, diethylenetriamine penta(methylene phosphonic acid) 1%, water 24% |
| 3D | Sulfuric acid 98%, water 2% |
| 3E | Hydrogen peroxide 17%, potassium hydroxide 0.2%, diethylenetriamine penta(methylene phosphonic acid) 0.0005%, water 82.7995% |
| 3F | Potassium hydroxide 0.2%, 1H-tetrazole 0.5%, diethylenetriamine penta(methylene phosphonic acid) 0.0005%, water 99.2995% |
| 3G | Hydrogen peroxide 17%, 1H-tetrazole 0.5%, diethylenetriamine penta(methylene phosphonic acid) 0.0005%, water 82.4995% |
| 3H | Hydrogen peroxide 17%, potassium hydroxide 0.2%, 1H-tetrazole 0.5%, water 82.3% |
| 3I | Hydrogen peroxide 17%, potassium hydroxide 0.2%, 1H-tetrazole 0.5%, ethylenediamine tetraacetic acid 1.2%, water 81.1% |
| 3J | Hydrogen peroxide 17%, potassium hydroxide 0.2%, 1H-tetrazole 0.5%, diethylenetriamine pentaacetic acid 1.2%, water 81.1% |
| 3K | Hydrogen peroxide 17%, potassium hydroxide 0.2%, 1H-tetrazole 0.5%, triethylenetetramine 1.2%, water 81.1% |
| 3L | Hydrogen peroxide 17%, potassium hydroxide 0.2%, 1H-tetrazole 0.5%, tetraethylenepentamine 1.2%, water 81.1% |
| 3M | Hydrogen peroxide 17%, potassium hydroxide 0.2%, 1H-tetrazole 0.5%, pentaethylenehexamine 1.2%, water 81.1% |
| 3N | Hydrogen peroxide 17%, potassium hydroxide 0.2%, 1H-tetrazole 0.5%, 1,4,7,10-tetraazacyclododecane 1.2%, water 81.1% |
| 3O | Hydrogen peroxide 17%, potassium hydroxide 0.2%, 1H-tetrazole 0.5%, 8-quinolinol 1.2%, water 81.1% |
| 3P | Hydrogen peroxide 17%, potassium hydroxide 0.2%, 1H-tetrazole 0.5%, 8-hydroxyquinaldine 1.2%, water 81.1% |
| 3Q | Hydrogen peroxide 17%, potassium hydroxide 0.2%, 1H-tetrazole 0.5%, 2,2'-azodiphenol 1.2%, water 81.1% |
| 3R | Hydrogen peroxide 17%, potassium hydroxide 0.2%, 1H-tetrazole 0.5%, phosphoric acid 0.0005%, water 82.2995% |
| 3S | Hydrogen peroxide 17%, potassium hydroxide 0.2%, ethylenediamine 0.5%, diethylenetriamine penta(methylene phosphonic acid) 0.0005%, water 82.2995% |
| 3T | Hydrogen peroxide 17%, potassium hydroxide 0.2%, ethanolamine 0.5%, diethylenetriamine penta(methylene phosphonic acid) 0.0005%, water 82.2995% |

TABLE 4

| Comparative Example | Cleaning solution | Immersion Temperature/° C. | time/min | Removal state I | II | Damage III | IV | Stability V |
|---|---|---|---|---|---|---|---|---|
| 1 | 3A | 50 | 1 | G | E | P | E | E1 |
| 2 | 3B | 50 | 3 | P | P | P | P | E1 |
| 3 | 3C | 50 | 3 | P | P | P | P | F |
| 4 | 3D | 70 | 20 | P | E | P | E | E2 |
| 5 | 3E | 50 | 3 | E | E | P | E | E1 |
| 6 | 3F | 50 | 3 | P | P | P | P | E2 |
| 7 | 3G | 50 | 3 | P | P | P | E | E1 |
| 8 | 3H | 50 | 3 | E | E | E | E | F |
| 9 | 3I | 50 | 3 | E | E | E | E | F |
| 10 | 3J | 50 | 3 | E | E | E | E | F |
| 11 | 3K | 50 | 3 | E | E | E | E | F |
| 12 | 3L | 50 | 3 | E | E | E | E | F |
| 13 | 3M | 50 | 3 | E | E | E | E | F |
| 14 | 3N | 50 | 3 | E | E | E | E | F |
| 15 | 3O | 50 | 3 | E | E | E | E | F |
| 16 | 3P | 50 | 3 | E | E | E | E | F |
| 17 | 3Q | 50 | 3 | E | E | E | E | F |
| 18 | 3R | 50 | 3 | E | E | E | E | F |
| 19 | 3S | 50 | 3 | E | E | P | E | E1 |
| 20 | 3T | 50 | 3 | E | E | P | E | E1 |

Removal state I: Removal state of hard mask 2

Removal state II: Removal state of dry etch residue 3

Damage III: Damage to cobalt or cobalt alloy 1

Damage IV: Damage to low-dielectric-constant interlayer dielectric film 4

Stability V: Stability of hydrogen peroxide

EXPLANATION OF REFERENCE NUMERALS

1: Cobalt or cobalt alloy
2: Hard mask
3: Dry etch residue
4: Low-dielectric-constant interlayer dielectric film
5: Barrier dielectric film
6: Copper or copper alloy
7: Barrier metal

The invention claimed is:

1. A liquid cleaning composition, comprising:
hydrogen peroxide at 10-30% by mass;
potassium hydroxide at 0.005-0.7% by mass;
aminopolymethylene phosphonic acid at 0.00001-0.01% by mass;
at least one selected from amines and azoles at 0.001-5% by mass; and
water,
wherein the amines are 1,2-propanediamine and/or 1,3-propanediamine.

2. The liquid cleaning composition according to claim 1, wherein the azoles are one or more selected from the group consisting of 1-methylimidazole, 1-vinylimidazole, 2-phenylimidazole, 2-ethyl-4-methylimidazole, N-benzyl-2-methylimidazole, 2-methylbenzimidazole, pyrazole, 4-methylpyrazole, 3,5-dimethylpyrazole, 1,2,4-triazole, 1H-benzotriazole, 5-methyl-1H-benzotriazole and 1H-tetrazole.

3. The liquid cleaning composition according to claim 1, wherein the aminopolymethylene phosphonic acid is one or more selected from the group consisting of amino tri(methylene phosphonic acid), ethylenediamine tetra(methylene phosphonic acid), diethylenetriamine penta(methylene phosphonic acid) and 1,2-propylenediamine tetra(methylene phosphonic acid).

4. A cleaning method for removing a hard mask and a dry etch residue in a semiconductor device, the method comprising bringing a liquid cleaning composition comprising hydrogen peroxide at 10-30% by mass, potassium hydroxide at 0.005-0.7% by mass, aminopolymethylene phosphonic acid at 0.00001-0.01% by mass, at least one selected from amines and azoles at 0.001-5% by mass and water, into contact with the semiconductor device,
wherein the amines are 1,2-propanediamine and/or 1,3-propanediamine.

5. The cleaning method according to claim 4, wherein the azoles are one or more selected from the group consisting of 1-methylimidazole, 1-vinylimidazole, 2-phenylimidazole, 2-ethyl-4-methylimidazole, N-benzyl-2-methylimidazole, 2-methylbenzimidazole, pyrazole, 4-methylpyrazole, 3,5-dimethylpyrazole, 1,2,4-triazole, 1H-benzotriazole, 5-methyl-1H-benzotriazole and 1H-tetrazole.

6. The cleaning method according to claim 4, wherein the aminopolymethylene phosphonic acid is one or more selected from the group consisting of amino tri(methylene phosphonic acid), ethylenediamine tetra(methylene phosphonic acid), diethylenetriamine penta(methylene phosphonic acid) and 1,2-propylenediamine tetra(methylene phosphonic acid).

7. The liquid cleaning composition according to claim 1, wherein the composition comprises at least one azole and at least one amine selected from the group consisting of 1,2-propanediamine and 1,3-propanediamine.

8. The liquid cleaning composition according to claim 7, wherein the composition comprises 1,2-propanediamine.

9. The liquid cleaning composition according to claim 7, wherein the composition comprises 1,3-propanediamine.

10. The liquid cleaning composition according to claim 7, wherein the composition comprises 1,2-propanediamine and 1,3-propanediamine.

* * * * *